(12) United States Patent
Butterworth

(10) Patent No.: US 11,320,722 B2
(45) Date of Patent: May 3, 2022

(54) FLASH MODULE CONTAINING AN ARRAY OF REFLECTOR CUPS FOR PHOSPHOR-CONVERTED LEDS

(71) Applicant: Lumileds LLC, San Jose, CA (US)

(72) Inventor: Mark Melvin Butterworth, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/849,741

(22) Filed: Apr. 15, 2020

(65) Prior Publication Data

US 2020/0241391 A1 Jul. 30, 2020

Related U.S. Application Data

(63) Continuation of application No. 15/312,608, filed as application No. PCT/IB2015/054539 on Jun. 16, 2015, now Pat. No. 10,649,315.

(Continued)

(51) Int. Cl.
*G03B 15/05* (2021.01)
*G03B 15/00* (2021.01)
(Continued)

(52) U.S. Cl.
CPC ............ *G03B 15/05* (2013.01); *G03B 15/00* (2013.01); *H01L 33/50* (2013.01); *H01L 33/60* (2013.01);
(Continued)

(58) Field of Classification Search
CPC ................. G03B 15/05; G03B 15/00; G03B 2215/0503; G03B 2215/0585;
(Continued)

(56) References Cited

U.S. PATENT DOCUMENTS

| 7,091,653 B2 | 8/2006 | Ouderkirk et al. |
| 7,221,864 B2 | 5/2007 | Seo |

(Continued)

FOREIGN PATENT DOCUMENTS

| CN | 1913151 A | 2/2007 |
| CN | 1916751 A | 2/2007 |

(Continued)

OTHER PUBLICATIONS

U.S. Appl. No. 15/312,608, filed Nov. 18, 2016, A Flash Module Containing an Array of Reflector Cups for Phosphor-Converted LEDs.

(Continued)

*Primary Examiner* — Gevell V Selby
(74) *Attorney, Agent, or Firm* — Schwegman Lundberg & Woessner, P.A.

(57) ABSTRACT

In a thin flash module for a camera, a rectangular array of LEDs is mounted on a single lead frame. The lead frame connects the LEDs in series. The LEDs are much smaller than conventional LEDs in a flash module. The LEDs may be in 5×3 array or a 4×3 array, for example. An array of reflective cups is molded over the lead frame or attached to the 10 lead frame, where each of the cups has a substantially square aperture to produce a square sub-beam. A layer of phosphor is located within each cup overlying its associated LED to produce white light. The aspect ratio of the array is selected to generally match the aspect ratio of the camera's field of view (e.g., 16:9). Since the LEDs are very small, the height of the cups may be small to form an ultra-thin flash module. Thin lenses may instead be used.

18 Claims, 2 Drawing Sheets

Related U.S. Application Data

(60) Provisional application No. 62/013,010, filed on Jun. 17, 2014.

(51) Int. Cl.
  *H01L 33/50* (2010.01)
  *H01L 33/60* (2010.01)

(52) U.S. Cl.
  CPC .............. *G03B 2215/0503* (2013.01); *G03B 2215/0567* (2013.01); *G03B 2215/0585* (2013.01); *G03B 2215/0592* (2013.01); *H01L 2224/16225* (2013.01)

(58) Field of Classification Search
  CPC .... G03B 2215/0592; G03B 2215/0567; H01L 33/50; H01L 33/60; H01L 2224/16225
  See application file for complete search history.

(56) References Cited

U.S. PATENT DOCUMENTS

| | | | |
|---|---|---|---|
| 7,284,871 B2 | 10/2007 | Oon et al. | |
| 7,461,948 B2 | 12/2008 | Van et al. | |
| 7,519,287 B2* | 4/2009 | Mok | G02B 27/0944 348/371 |
| 7,838,897 B2* | 11/2010 | Higashi | H01L 33/60 257/99 |
| 7,984,999 B2 | 7/2011 | Harbers et al. | |
| 8,974,082 B2 | 3/2015 | Matsuwaki | |
| 9,086,213 B2 | 7/2015 | Harbers et al. | |
| 10,649,315 B2 | 5/2020 | Butterworth | |
| 2004/0159850 A1* | 8/2004 | Takenaka | H01L 33/486 257/98 |
| 2005/0056858 A1 | 3/2005 | Kakiuchi et al. | |
| 2007/0040097 A1 | 2/2007 | Mok et al. | |
| 2007/0091602 A1 | 4/2007 | Van et al. | |
| 2008/0128735 A1 | 6/2008 | Yoo et al. | |
| 2009/0152582 A1 | 6/2009 | Chang et al. | |
| 2009/0168072 A1 | 7/2009 | Visser et al. | |
| 2010/0181582 A1* | 7/2010 | Li | H01L 33/54 257/91 |
| 2013/0051014 A1 | 2/2013 | Sikkens et al. | |
| 2013/0215596 A1* | 8/2013 | Holman | G03B 15/05 362/84 |
| 2014/0078378 A1 | 3/2014 | Demers et al. | |
| 2015/0102744 A1 | 4/2015 | Muto | |
| 2016/0043285 A1 | 2/2016 | Basin et al. | |
| 2017/0062678 A1* | 3/2017 | Butterworth | H01L 33/486 |
| 2017/0184944 A1 | 6/2017 | Butterworth | |

FOREIGN PATENT DOCUMENTS

| | | |
|---|---|---|
| CN | 1981378 A | 6/2007 |
| CN | 101252163 A | 8/2008 |
| CN | 101586753 A | 11/2009 |
| CN | 202004043 U | 10/2011 |
| CN | 103000789 A | 3/2013 |
| CN | 103026517 A | 4/2013 |
| CN | 111123620 A | 5/2020 |
| DE | 102004045950 A1 | 3/2006 |
| EP | 2124255 A1 | 11/2009 |
| EP | 2553319 B1 | 3/2017 |
| EP | 3158393 A1 | 4/2017 |
| JP | 2005-019675 A | 1/2005 |
| JP | 2005-114924 A | 4/2005 |
| JP | 2005091675 A | 4/2005 |
| JP | 2005-164990 A | 6/2005 |
| JP | 2007180520 A | 7/2007 |
| JP | 2007-266358 A | 10/2007 |
| JP | 2008513983 A | 5/2008 |
| JP | 2011-114096 A | 6/2011 |
| JP | 2014011359 A | 1/2014 |
| KR | 102244461 B1 | 4/2021 |
| TW | 200425531 A | 11/2004 |
| TW | 200727090 A | 7/2007 |
| TW | 201401585 A | 1/2014 |
| TW | 201947309 A | 12/2019 |
| WO | WO-2013122722 A1 | 8/2013 |
| WO | WO-2013161883 A1 | 10/2013 |
| WO | WO-2014002628 A1 | 1/2014 |
| WO | WO-2015-049146 A1 | 4/2015 |
| WO | WO-2015193807 A1 | 12/2015 |

OTHER PUBLICATIONS

"Japanese Application Serial No. 2016-573842, Examiners Decision of Final Refusal dated Dec. 22, 2020", (w/ English Translation), 10 pgs.
"Korean Application Serial No. 10-2017-7001379, Decision to Grant dated Feb. 9, 2021", (w/ English Translation), 4 pgs.
"Korean Application Serial No. 10-2017-7001379, Response filed Dec. 2, 2020 to Notice of Preliminary Rejection dated Oct. 20, 2020", (w/Translation of English Claims), 18 pgs.
"Taiwanese Application Serial No. 109119210, Office Action dated Jan. 8, 2021", (w/ English Translation), 7 pgs.
"Chinese Application Serial No. 201580032616.X, First Office Action dated Aug. 30, 2018", (w/ English Translation), 15 pgs.
"Chinese Application Serial No. 201580032616.X, Response filed Dec. 21, 2018 to First Office Action dated Aug. 30, 2018", (w/ English Translation), 16 pgs.
"European Application Serial No. 15745244.2, Office Action dated May 14, 2020", 6 pgs.
"European Application Serial No. 15745244.2, Response Aug. 19, 2020 to Office Action dated May 14, 28", 25 pgs.
"European Application Serial No. 15745244.2, Response filed Jul. 18, 2019 to Office Action dated Apr. 4, 2019", 25 pgs.
"Japanese Application Serial No. 2016-573842, Written Argument and Amendment filed Jul. 22, 2020 to Office Action dated May 12, 2020", (w/ English Translation), 7 pgs.
"Korean Application Serial No. 10-2017-7001379, Notice of Preliminary Rejection dated Oct. 20, 2020", 15 pgs.
"Taiwanese Application Serial No. 104119627, Office Action dated Nov. 7, 2018", (w/ English Translation), 10 pgs.
"Taiwanese Application Serial No. 104119627, Response filed Feb. 11, 2019 to Office Action dated Nov. 7, 2018", (w/ English Translation), 24 pgs.
"Chinese Application Serial No. 201580032616.X, Decision of Rejection dated Sep. 3, 2019", (w/ English Translation), 19 pgs.
"Chinese Application Serial No. 201580032616.X, Response filed Jun. 14, 2019 to Office Action dated Apr. 15, 2019", (w/ English Translation of Amended Claims), 6 pgs.
"Japanese Application Serial No. 2016-573842, Final Notification of Reasons for Refusal dated May 12, 2020", (w/ English Translation), 6 pgs.
"Japanese Application Serial No. 2016-573842, Notification of Reasons for Rejection dated Nov. 19, 2019", (w/ English Translation), 4 pgs.
"Japanese Application Serial No. 2016-573842, Response filed Aug. 13, 2019 to Office Action dated May 14, 2019", (w/ English Translation of Claims), 6 pgs.
"Japanese Application Serial No. 2016-573842, Written Argument and Amendment filed Apr. 2, 2020 to Notification of Reasons for Rejection dated Nov. 19, 2019", (w/ English Translation), 7 pgs.
"Taiwanese Application Serial No. 108112157, Office Action dated Nov. 20, 2019", (w/ English Translation), 7 pgs.
"Taiwanese Application Serial No. 108112157, Response filed Feb. 18, 2020 to Office Action dated Nov. 20, 2019", (w/ English Translation of Claims), 17 pgs.
"U.S. Appl. No. 15/312,608, Final Office Action dated Oct. 8, 2019", 12 pgs.
"U.S. Appl. No. 15/312,608, Non Final Office Action dated May 16, 2019", 11 pgs.
"U.S. Appl. No. 15/312,608, Notice of Allowance dated Jan. 9, 2020", 7 pgs.
"U.S. Appl. No. 15/312,608, Preliminary Amendment filed Nov. 18, 2016", 7 pgs.

(56) References Cited

OTHER PUBLICATIONS

"U.S. Appl. No. 15/312,608, Response filed Dec. 9, 2019 to Final Office Action dated Oct. 8, 2019", 11 pgs.
"U.S. Appl. No. 15/312,608, Response filed Aug. 16, 2019 to Non-Final Office Action dated May 16, 2019", 14 pgs.
"Chinese Application Serial No. 201580032616.X, Office Action dated Apr. 15, 2019", w/English translation, 22 pgs.
"European Application Serial No. 15745244.2, Communication pursuant to Article 94(3) EPC dated Apr. 4, 2019", 7 pgs.
"International Application Serial No. PCT/IB2015/054539, International Preliminary Report on Patentability dated Dec. 29, 2016", 8 pgs.
"International Application Serial No. PCT/IB2015/054539, International Search Report dated Nov. 2, 2015", 3 pgs.
"International Application Serial No. PCT/IB2015/054539, Written Opinion dated Nov. 2, 2015", 6 pgs.
"Japanese Application Serial No. 2016-573842, Office Action dated May 14, 2019", W/English Translation, 6 pgs.
"Chinese Application Serial No. 201580032616.X, Notice of Decision dated Mar. 30, 2021", (w/ English Translation), 31 pgs.
"Chinese Application Serial No. 201580032616.X, Notice of Reexamination dated Feb. 7, 2021", (w/ English Translation), 20 pgs.
"Chinese Application Serial No. 201580032616.X, Request for Reexamination filed Dec. 4, 2019 in response to Decision of Rejection dated Sep. 3, 2019", (w/ EnglishTranslation), 10 pgs.
"Chinese Application Serial No. 201580032616.X, Response filed Mar. 5, 2021 to Notice of Reexamination dated Feb. 7, 2021", (w/ English Translation), 14 pgs.
"Chinese Application Serial No. 201911309631.0, Office Action dated Apr. 30, 2021", (w/ English Translation), 26 pgs.
"Chinese Application Serial No. 201911309631.0, Response filed Aug. 3, 2021 to Office Action dated Apr. 30, 2021", (w/ English Translation of Claims), 14 pgs.
"Taiwanese Application Serial No. 109119210, Office Action dated Jun. 3, 2021", (w/ English Translation), 7 pgs.
"Taiwanese Application Serial No. 109119210, Response filed Mar. 10, 2021 to Office Action dated Jan. 8, 2021", (w/ English Translation of Claims), 18 pgs.
"Taiwanese Application Serial No. 109119210, Response filed Aug. 10, 2021 to Office Action dated Jun. 3, 2021", (w/ English Translation of Claims), 24 pgs.
"Chinese Application Serial No. 201911309631.0, Office Action dated Nov. 12, 2021", (w/ English Translation), 14 pgs.

\* cited by examiner

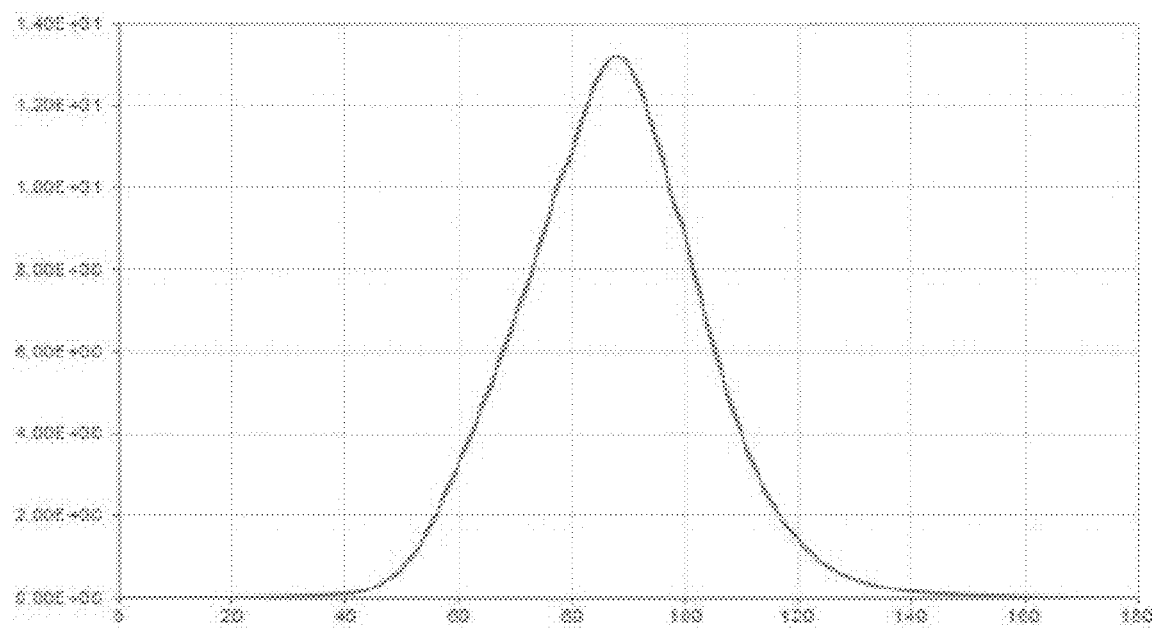
Fig. 3
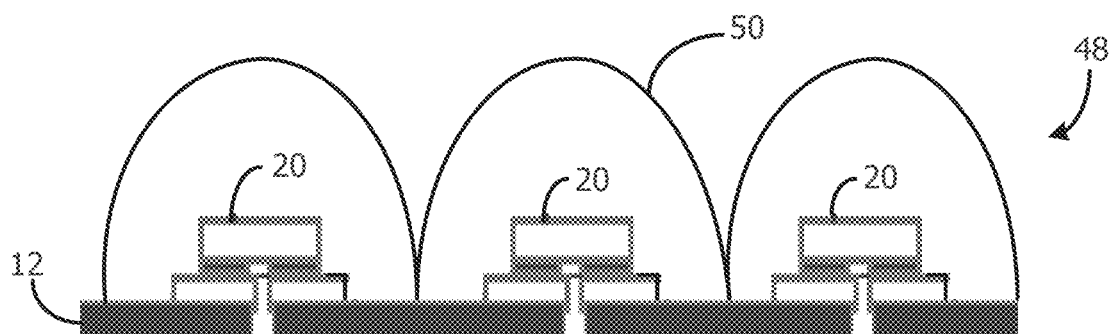
Fig. 4
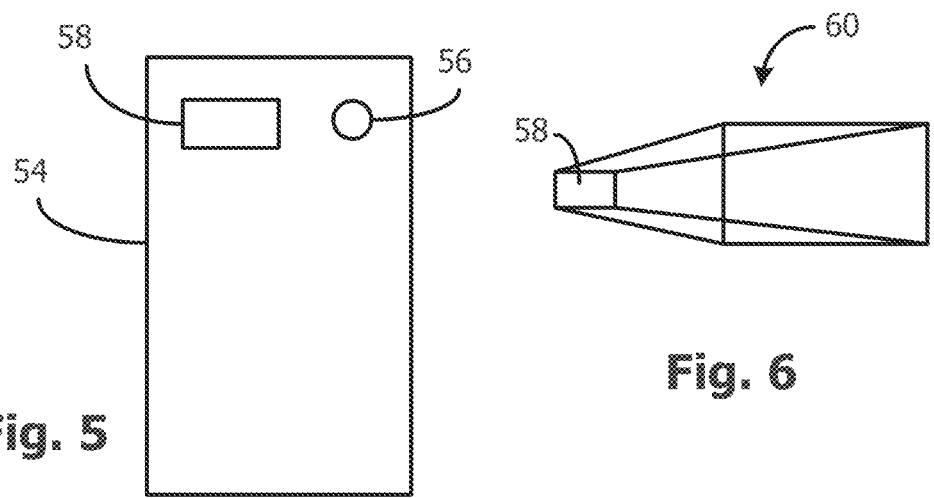
Fig. 5
Fig. 6

FLASH MODULE CONTAINING AN ARRAY OF REFLECTOR CUPS FOR PHOSPHOR-CONVERTED LEDS

CROSS-REFERENCE TO RELATED APPLICATIONS

The present application is a continuation of U.S. application Ser. No. 15/312,608, filed Nov. 18, 2016, which is a § 371 application of International Application No. PCT/IB2015/054539 filed on Jun. 16, 2015 and entitled "A FLASH MODULE CONTAINING AN ARRAY OF REFLECTOR CUPS FOR PHOSPHOR-CONVERTED LEDS," which claims the benefit of U.S. Provisional Patent Application No. 62/013,010, filed Jun. 17, 2014. U.S. application Ser. No. 15/312,608, International Application No. PCT/IB2015/054539 and U.S. Provisional Patent Application No. 62/013,010 are incorporated herein.

FIELD OF THE INVENTION

This invention relates to packaged light emitting diodes (LEDs) and, in particular, to an array of phosphor-converted LED dies mounted in an array of collimating reflector cups or lenses for a thin camera flash.

BACKGROUND

Cameras are prevalent in smartphones and other devices that are relatively thin. The camera flash is frequently formed of one or two phosphor-converted LEDs. The combined area of the LEDs typically determines the instantaneous brightness of the flash for a given driving current pulse. The bare LED die is GaN-based and emits blue light, and the phosphor adds a yellow component (or red and green components) so the combination of the blue light leaking through the phosphor and the phosphor light creates the bright white light for the flash.

The camera typically uses a Fresnel lens or other type of molded plastic lens to collimate the light in an attempt to direct most of the light at the subject in the camera's field of view.

Lenses cause some back reflection, which is substantially absorbed by the flash module. Lenses are relatively thick, and the distance from the top of the lens to the LED die surface depends on the footprint of the LED die. Since relatively large LED die sizes are used to obtain the required brightness with the fewest LED dies, the lens must be fairly thick. Further, the lenses generally create a conical emission pattern which does not correspond to the rectangular field of view of the camera. Accordingly, the prior art LED flash modules for cameras are relatively thick and illuminate a large area beyond the field of view of the camera, wasting such light energy.

What is needed is an LED camera flash module that is thinner than the prior art flash modules and produces a beam that more closely matches the aspect ratio of the camera's field of view.

SUMMARY

A thin flash module for a camera uses an array of small LED dies, where the total light-emitting area of the LEDs may equal the area of the one or two large LED(s) in a conventional flash to achieve the desired flash brightness. For example, for a 3×5 array of LED dies, the size of each LED die may be as little as about $\frac{1}{15}$ the size of the conventional LED dies used in a flash module.

Each small LED die is surrounded by a reflective cup. The light exit aperture of each cup is substantially a square (corresponding to the shape of the LED), so that the overall beam of the flash module will be formed of an array of generally square sub-beams. Other rectangular or oblong shapes are envisioned and are included within the scope of the invention.

The cups may be formed in a connected array of plastic cups molded over a lead frame, where leads of the lead frame are exposed at the bottom of each cup for connection to the LED electrodes. The walls of the cups may be coated with a specular metal film, such as silver, aluminum, or chromium. The lead frame connects the LEDs in series or in a combination of series and parallel. The cups may form a 16×9 array (columns×rows), a 5×3 array, a 4×3 array, or other size to generally correspond to the aspect ratio of the camera's field of view. For example, if the camera's field of view aspect ratio is 16:9, a suitable reflective cup array may be 5×3 to sufficiently approximate the aspect ratio. Using LED dies which have relatively small edge dimensions permits a relatively small required height (z-axis height) and area of each rectangular cup. The more LED dies used, the smaller each LED die can be, and the thinner the flash module can be. The height of the cups is much less than the height of collimating lenses used in the prior art.

In another embodiment, the LED dies are pre-mounted on the lead frame, and the reflective cups (having a hole at their base) are affixed to the lead frame and surround each LED die.

In another embodiment, the array of cups is stamped from a metal sheet, where the edges of each cup facing the LED can be made knife edges so all light is reflected toward the exit aperture of the cup.

Although the lateral dimensions of the flash module may be larger than conventional LED flash modules, due to the use of a 2-dimensional array of small LED dies, the thickness will be much smaller.

In one embodiment, the LED dies are GaN based and emit blue light. A mixture of phosphor powder (e.g., YAG phosphor) and silicone, having an index of refraction between that of GaN and air to increase light extraction, is deposited to a precise thickness in each cup to create the target white light temperature. The rim of the cup is higher than the phosphor so the cup collimates the phosphor light. The phosphor mixture also encapsulates the LED dies to block moisture, provide mechanical support, etc.

In another embodiment, the LED dies are conformally coated with phosphor prior to being mounted in the cups. In such an embodiment, a clear encapsulant (e.g., silicone) may be deposited in the cups to encapsulate the LED dies and increase light extraction.

Additional features and embodiments are described herein.

BRIEF DESCRIPTION OF THE DRAWINGS

FIG. 3 is an example of an emission profile from each cup, where the profile is fairly collimated to generally limit the overall illumination by the flash module to the field of view of the camera.

FIG. 4 is cross-section of a flash module having an array of small LED dies and an array of collimating lenses, where the array forms a rectangle having dimensions generally corresponding to the aspect ratio of the camera's field of view, in accordance with one embodiment of the present invention. The lenses are thin due to the small dimensions of the LED dies.

FIG. 5 is a back view of a smartphone showing the camera's rectangular flash module and lens area, where the flash module is in accordance with the present invention.

FIG. 6 illustrates the ideal flash emission profile generated by the rectangular array of LED dies and cups forming the flash module.

Elements that are the same or similar are labeled with the same numeral.

DETAILED DESCRIPTION

Figure 1:
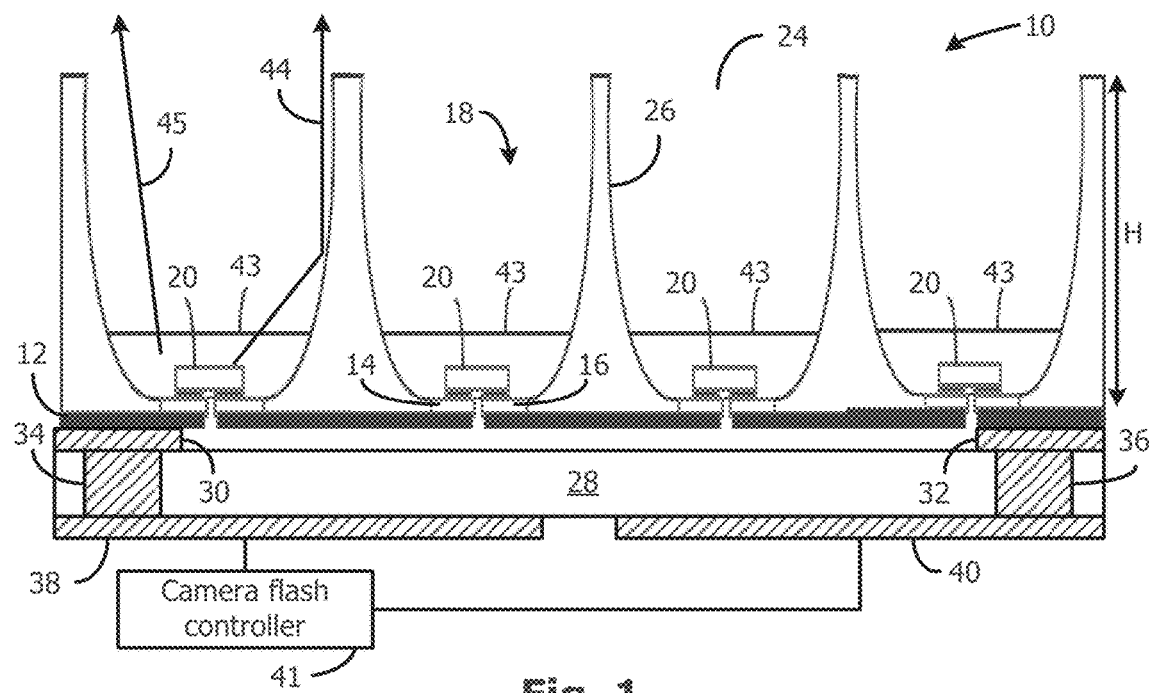
FIG. 1 is a cross-section of a flash module having a 2-dimensional array of small LED dies within reflective cups, where each cup has a square exit aperture, and where the array dimensions generally correspond to the aspect ratio of the camera's field of view, in accordance with one embodiment of the present invention.

FIG. 1 is a cross-section of a reflective cup package 10 including an array of LED dies and their associated reflective cups in a 2-dimensional array. A copper lead frame 12 is stamped from a sheet and provides metal contact pads 14 and 16 at the base of each reflective cup 18. The anode and cathode electrodes of LED dies 20 are connected to the associated contact pads 14 and 16. The lead frame 12 is shown connecting four LED dies 20 in series, and the plastic cup material is molded around the lead frame 12 to maintain the structural integrity of the lead frame after singulation. The lead frame 12 may also connect the LED dies 20 in a combination of series and parallel. There may be an array of lead frames connected together to simplify processing of the packages, and the lead frames are separated (singulatd) after the processing info the individual packages 10.

The area where the copper lead frame 12 is to be bonded to the bottom LED die electrodes may be plated with a suitable metal, such as gold, nickel, or alloys, to form the contact pads 14 and 16. Gold balls, solder wetting, or other techniques, if required, may also be used to allow bonding to the LED die electrodes. Although the LED dies 20 are shown as flip-chips, the LED dies may have one or both electrodes on its top surface that is/are wire-bonded to the contact pads 14/16. The lead frame 12 and cup material act as a heat sink to remove heat from the LED dies 20.

The array of plastic cups 18 is molded over the lead frame 12 either before or after the LED dies 20 are mounted on the lead frame 12. Compression molding or injection molding may be used. Preferably, the plastic is thermally conductive. If the plastic is also electrically conductive due to containing metal particles (for increasing its thermal conductivity), the portion of the lead frame 12 in contact with the plastic has a dielectric coating formed over it prior to the molding step to prevent shorting the pads 14 and 16 to each other.

Each cup 18 generally forms a square center base 22, a square outer perimeter, and a square light exit aperture 24. As used herein, the term rectangle includes a square. The shape of the cup 18 corresponds to the shape of the LED die 20, so an elongated LED die 20 would cause the cup's 18 aperture to have the same relative dimensions as the LED die 20 and not be square. The interior walls 26 of each cup 16 are coated with a reflective material, such as a deposited metal film (e.g., silver, chromium, aluminum). Evaporation, sputtering, spraying, or other technique may be used. The interior walls 26 may instead be coated with other types of films, such as a dichroic coating, that reflect the direct LED die light and the phosphor light or only reflect the LED light or only reflect the phosphor light. The reflective material may be specular for the narrowest beam or may be diffusive (such as by using white paint or a white cup material) for a wider beam.

Instead of molding the array of cups 18 over the lead frame 12, the array of cups 18 may be machined or stamped from a reflective material, such as aluminum. By stamping the array of cups 18 from a metal sheet, the bottom edges facing the LED dies 20 may be knife edges so there is little or no reflection back towards the LED dies 20. If the array of cups 18 is not molded over the lead frame 12, the array is affixed to the lead frame 12 with an adhesive, such as a thermally conductive epoxy. If the array of cups 18 is formed of a metal, a dielectric layer is formed between the array of cups 18 and the lead frame 12. The LED dies 20 extend through an opening at the bottom of each cup 18.

FIG. 1 also illustrates a substrate 28 supporting the lead frame 12 and cups 18, which may act as an interposer between the lead frame 12 and a printed circuit board and helps to spread heat. The substrate 28 may be a molded ceramic, plastic, or other thermally conductive material. In one embodiment, the substrate 28 is a molded plastic and an integral part of the plastic cups 18 molded over the lead frame 12 so is considered part of the array of cups 18. In an alternative embodiment, the substrate 28 may be eliminated and the lead frame 12 may be used to attach the package 10 to a circuit board.

The substrate 28 includes top metal pads 30 and 32 connected to the anode and cathode ends of the LED die 20 string. Metal vias 34 and 36 extending through the substrate 28 contact robust bottom metal pads 38 and 40 that may be soldered to a printed circuit board. The circuit board may have traces connected to a camera flash controller 41 for delivering a pulse of current to the LED dies 20 when taking a picture.

Figure 2:
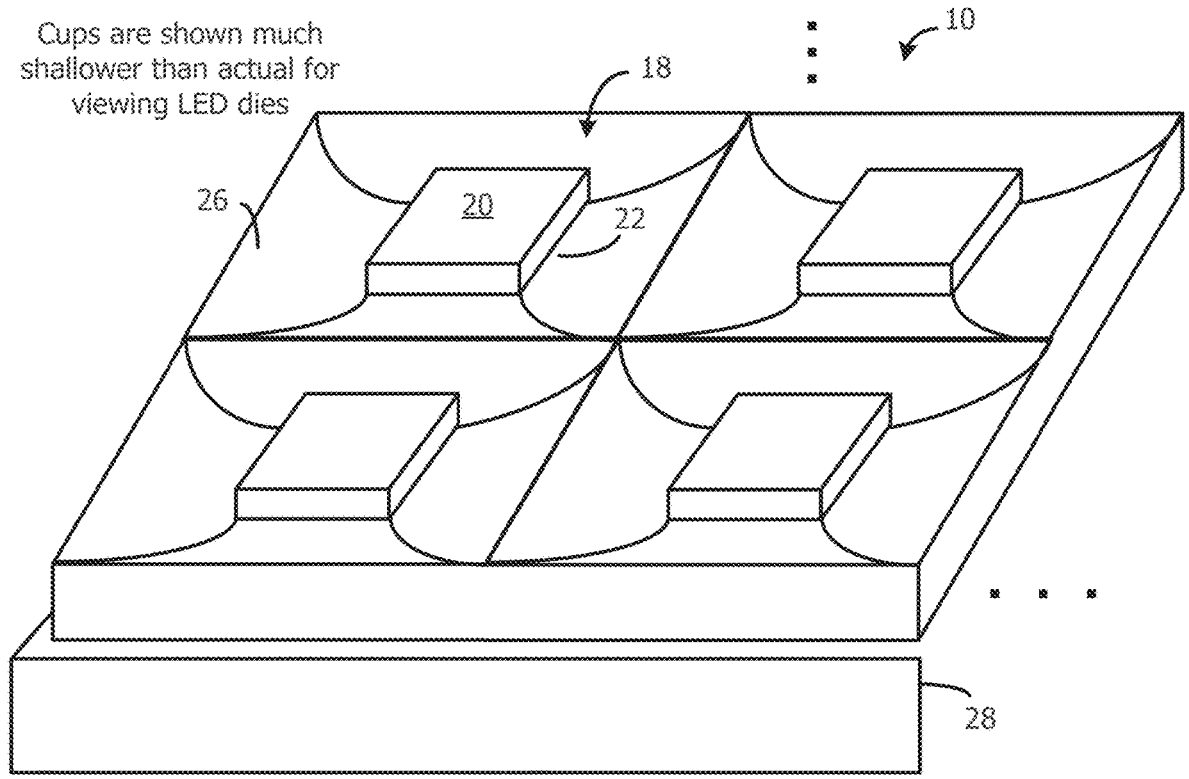
FIG. 2 is a perspective view of a small portion of the array of FIG. 1, prior to the LED dies being encapsulated, where the cups are made much shallower than actual in order to see the LED dies within the cups.

FIG. 2 is a perspective view of a small part of the package 10, showing only four cups 18 and their associated LED dies 20. The relative heights of the cups 18 have been reduced compared to the heights shown in FIG. 1 in order to show the LED dies 20 at the bottom of the cups 18.

FIG. 2 illustrates an LED die 20 mounted at the base of each cup 18. In the example, the LED dies 20 are GaN-based flip-chips and emit blue light. In another embodiment, the LED dies 20 may emit UV and/or are not flip-chips. For LED dies with one or both electrodes on top, a wire may connect the electrode(s) to the pads 14/16, and one of or both of pads 14/16 would extend beyond the LED die footprint. Any metal thermal pad of the LED die is thermally coupled to the substrate 28.

Since the array of cups 18 may form a 5×3 array (to approximate a typical 16:9 camera field of view) or any other size, the LED die 20 in each cup 18 is much smaller than a conventional LED die used in a flash module. For example, for a 5×3 array, the LED dies 20 may be less than ⅕ the size of a single LED die that delivers the same light output power for the same current pulse. Ideally, for a 5×3 array, the LED dies 20 may be ¹⁄₁₅ the size of the conventional LED die. The required height H of each cup 18 and the other dimensions of each cup 18 depend on the size of the LED die 20. For the extremely small sizes of the LED dies 20 described herein, the height of each cup 18 may be only about 1 mm. Each side of the LED die 20 may be less than 0.25 mm and the LED die 20 may have a height of only a few tens of microns, since the growth substrate (e.g. sapphire) has been removed. For flip-chips, a transparent growth substrate may remain on the LED die 20 to increase its side emission to provide a more uniform light emission from each cup 18. The light exit aperture of each cup 18 may be only 1-3 millimeters.

Typically sizes of the array to generally correspond to the camera's field of view may be 5×3 and 4×3.

In one embodiment, a precise amount of a mixture 43 of phosphor powder and silicone is dispensed in each cup 18 to encapsulate the LED die 20 and wavelength-convert the LED light. A certain amount of the blue LED light leaks through the cured mixture 43, and the blue light combines with the phosphor light to generate any overall color, such as white light for the flash. The phosphor powder may be YAG or other phosphor.

Alternatively, each LED die 20 is conformally coated with a layer of phosphor prior to being mounted on the lead frame 12. The phosphor may also be affixed as a pre-formed tile over each LED die 20. In such a case, a transparent encapsulant may be deposited in each cup 18. The encapsulant may include an additional phosphor, such as red phosphor, to generate the desired wavelengths for the flash.

In FIG. 1, a light ray 44 from the LED die 20 is shown leaking through the mixture 43, and a light ray 45 is shown being emitted from, a phosphor particle. The light ray 44 is shown reflecting off a wall 26 of the cup 18 and being emitted substantially normal to the flash module since the walls 26 are semi-parabolic to collimate the light. The walls 26 may be shaped to create a wider beam.

Since no lens is used, the entire flash module, minus the substrate 28, may be about 1-3 mm thick. The lead frame 12 may be very thin since it is not used for mechanical support.

If each cup 18 opening was 2 mm, the minimum footprint for a 5×3 array would be about 6×10 mm. This is larger than a conventional flash module footprint (since only 1 or 2 LED dies are used) but the height is much less.

Since each cup 18 emits a generally square beam, the array aspect ratio is selected to generally match the rectangular aspect ratio of the camera's field of view, such as 16:9, 5:3, 4:3, etc.

The size of the optional substrate 28 is not relevant to the operation of the invention and typically has a footprint slightly larger than the array of cups 18. If the lead frame has sufficient structural strength or the mounting area of the array is sufficiently stiff, the substrate 28 may be eliminated.

FIG. 3 illustrates a sample half-brightness emission profile front a single cup 18, where the Y-axis corresponds to the brightness level, and the X-axis corresponds to the viewing angle, where 90 degrees is along the center line of the cup 18. The profile is much narrower than a typical flash emission profile since the emitted light is intended to be concentrated within the field of view of the camera.

Since each LED die 20 is much smaller than a conventional LED die in a flash, even molded lenses can be used while maintaining a very thin flash module profile. FIG. 4 is a cross-section of a portion of a flash module 48 showing three LED dies 20 mounted on the lead frame 12 and a molded array of transparent lenses 50 encapsulating the LED dies 20. The lenses 50 may have any shape to achieve the desired emission profile per LED die 20. The resulting beam will generally have a profile generally corresponding to the dimensions of the rectangular a tray (e.g., aspect ratio of 5:3, 4:3, etc.). The height of each lens 50 will be less than 3 mm and typically less than 1 mm.

FIG. 5 shows the back side of a conventional smartphone 54 containing a camera, showing the camera lens area 56 and the rectangular flash module area 58, having an aspect ratio approximately equal to the camera's field of view aspect ratio. A clear flat protective window may form part of the housing for protecting the flash module. When the smartphone 54 is used as a camera, it is considered a camera for purposes of this disclosure. Instead of a smartphone. FIG. 5 may illustrate a dedicated camera, which may also have a video function. The flash module may be operated at a percentage of its full brightness when used in the video mode.

FIG. 6 illustrates the half-brightness emission profile of the camera flash by the smartphone 54 when taking a picture. The beam 60 broadens from the rectangular source flash module and generally retains its rectangular shape. Since each reflective cup emits a generally square beam, the resulting beam has an aspect ratio that corresponds to the aspect ratio of the LED/cup array.

In one embodiment, the cups 18 or lenses 50 may be shaped differently across the array to create an optimal beam.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An illumination system, comprising:
   an array of light emitting diodes (LEDs) configured to produce light; and
   an array of cups associated with the array of LEDs,
   each cup having an exit aperture,
   each cup having reflective walls surrounding an associated LED,
   each reflective wall having a cross-section, taken in a plane orthogonal to a plane of the exit aperture, that includes a rounded portion that is shaped to collimate light exiting the cup to illuminate a field of view,
   the array of cups having an aspect ratio that generally matches an aspect ratio of the field of view,
   each LED being positioned at a relative LED location within the exit aperture of the associated cup,
   the relative LED locations being the same for all of the cups in the array of cups.

2. The illumination system of claim 1, further comprising a lead frame configured to electrically couple at least some of the LEDs in series.

3. The illumination system of claim 2, wherein the array of LEDs is mounted on the lead frame.

4. The illumination system of claim 2, wherein the array of cups is formed as a unitary array of cups molded over the lead frame.

5. The illumination system of claim 2, wherein the array of cups is formed of a stamped metal sheet and affixed to the lead frame.

6. The illumination system of claim 2, further comprising a drive circuit configured to provide current to the lead frame to illuminate the array of LEDs.

7. The illumination system of claim 1, further comprising a phosphor located within each cup overlying the LED in the cup.

8. The illumination system of claim 7, wherein:
   the phosphor comprises a mixture of a binder and phosphor powder; and
   the mixture at least partially encapsulates the LED within each respective cup.

9. The illumination system of claim 7, wherein:
the phosphor in each cup only partially fills the cup so that light emitted by the phosphor is substantially reflected by the cup toward the light exit aperture and collimated; and
the phosphor is located at a bottom of the cup or above the bottom of the cup such that a portion of the light that is emitted by the phosphor is emitted parallel to a top surface of the LED and impinges on the reflective walls of the associated cup and is substantially reflected toward the light exit aperture.

10. The illumination system of claim 1, wherein each cup has a substantially rectangular aperture.

11. The illumination system of claim 1, wherein each cup has a substantially square aperture.

12. The illumination system of claim 1, wherein there are no shaped lenses over the LEDs used to collimate light.

13. The illumination system of claim 1, wherein the cup is shaped such that light exiting a side of the associated LED is substantially reflected by the cup toward the light exit aperture.

14. The illumination system of claim 1, wherein the field of view corresponds to a field of view of a camera that is coupled to the array of LEDs and the array of cups.

15. A method for producing an illumination system, the method comprising:
positioning an array of cups with respect to an array of LEDs such that when positioned:
each cup has an exit aperture,
each cup has reflective walls surrounding an associated LED,
each reflective wall has a cross-section, taken in a plane orthogonal to a plane of the exit aperture, that includes a rounded portion that is shaped to collimate light exiting the cup to illuminate a field of view,
the array of cups having an aspect ratio that generally matches an aspect ratio of the field of view,
each LED is positioned at a relative LED location within the exit aperture of the associated cup, and
the relative LED locations are the same for all of the cups in the array of cups.

16. The method of claim 15,
wherein the array of LEDs is mounted on a single lead frame; and
wherein positioning the array of cups with respect to the array of LEDs comprises forming the array of cups as a unitary array of cups molded over the lead frame.

17. The method of claim 16, further comprising attaching a drive circuit to the lead frame to provide current to the lead frame to illuminate the array of LEDs.

18. An illumination system, comprising:
a camera having a field of view;
an array of light emitting diodes (LEDs) coupled to the camera and configured to produce light, the array of LEDs being mounted on a single lead frame that electrically connects at least some of the LEDs in series;
a drive circuit configured to provide current to the lead frame to illuminate the array of LEDs; and
an array of cups associated with the array of LEDs,
the array of cups having an aspect ratio that generally matches an aspect ratio of the field of view,
each cup having an exit aperture,
each cup having reflective walls surrounding an associated LED,
each reflective wall having a cross-section, taken in a plane orthogonal to a plane of the exit aperture, that includes a rounded portion that is shaped to collimate light exiting the cup to illuminate the field of view of the camera,
each LED being positioned at a relative LED location within the light exit aperture of the associated cup, the relative LED locations being the same for all of the cups in the array of cups.

* * * * *